(12) United States Patent
Welsch et al.

(10) Patent No.: US 6,373,272 B1
(45) Date of Patent: Apr. 16, 2002

(54) ARRANGEMENT FOR THE TESTING OF SEMICONDUCTOR STRUCTURES

(75) Inventors: Reinhard Welsch; Claus Dietrich, both of Dresden; Thomas Huelsmann, München; Dietmar Runge, Grosserkmannsdorf, all of (DE)

(73) Assignee: Karl Suss Dresden GmbH, Sacka (DE)

( * ) Notice: Subject to any disclaimer, the term of this patent is extended or adjusted under 35 U.S.C. 154(b) by 0 days.

(21) Appl. No.: 09/142,391

(22) PCT Filed: Feb. 12, 1997

(86) PCT No.: PCT/DE97/00260

§ 371 Date: Sep. 16, 1998

§ 102(e) Date: Sep. 16, 1998

(87) PCT Pub. No.: WO97/29380

PCT Pub. Date: Aug. 14, 1997

(30) Foreign Application Priority Data

Feb. 12, 1996 (DE) .......................................... 196 04 883

(51) Int. Cl.[7] ......................... G01R 31/26; G01R 31/02; H01H 31/02
(52) U.S. Cl. ....................... 324/765; 324/760; 324/537
(58) Field of Search ................................ 324/765, 537, 324/760

(56) References Cited

U.S. PATENT DOCUMENTS

| | | | | |
|---|---|---|---|---|
| 3,702,439 A | * | 11/1972 | Mc Gahey et al. | 324/762 |
| 3,866,119 A | * | 2/1975 | Ardezzone et al. | 324/754 |
| 3,936,743 A | * | 2/1976 | Roch | 324/537 |
| 3,996,517 A | | 12/1976 | Fergason et al. | |
| 5,321,435 A | * | 6/1994 | Mori et al. | 324/758 |
| 5,404,111 A | * | 4/1995 | Mori et al. | 324/758 |

(List continued on next page.)

FOREIGN PATENT DOCUMENTS

JP 7-14898 1/1995

OTHER PUBLICATIONS

IBM Technical Disclosure Bulletin, vol. 28, No. 12, May 1986, pp. 5543–5549, "Test Module Assembly" see p. 5543, paragraph 1, see p. 5544, paragraph 3—p. 5545, paragraph 1, see figures 1,5.

Proceedings of the Instrumentation and Measurement Technology Conference, Advanced Technologies Conference, Advanced Technologies Conference, Advanced Technologies In I & M Hamamatsu, May 10–12, 1994, vol. 3, May 10, 1994, Institutite of Electrical and Electronics Engineers, pp. 1492–1496, Inuzuka E et al: "Emission Microscopy in Semiconductor Failure Analysis" see abstract, see p. 1495, col. 2, paragraph 1–3 see figures 1,6.

*Primary Examiner*—Safet Metjahic
*Assistant Examiner*—Jermele M. Hollington
(74) *Attorney, Agent, or Firm*—Jordan and Hamburg LLP (57) ABSTRACT

The present invention provides an apparatus for the testing of semiconductor structures. The apparatus is provided with a chuck for holding a semiconductor wafer and with needle holders for contact needles, the chuck being provided with a fastening device for the semiconductor wafer and being movable for positioning, controlled using a positioning device, in relation to the contact needles. The object of the present invention is to detect faults, in good time and reliably, of non-serviceable or not fully serviceable chips before separation to avoid unnecessary work for separating and assembling defective chips. The object is attained in that the chuck has a receiving area exposing upwards a lower surface of the semiconductor wafer and a receiving plane therefor. The receiving plane is arranged above the needle carrier, and the contact needles point upwards in such a manner that they contact contact islands of the semiconductor chips on the downwardly directed upper surface of the semiconductor wafer.

17 Claims, 6 Drawing Sheets

U.S. PATENT DOCUMENTS

| | | |
|---|---|---|
| 5,493,236 A | 2/1996 | Ishii et al. |
| 5,532,607 A * | 7/1996 | Inuzuka et al. ............. 324/750 |
| 5,807,104 A * | 9/1998 | Ikeya et al. ................. 324/765 |
| 5,955,877 A * | 9/1999 | Farnworth et al. .......... 324/765 |
| 6,002,792 A * | 12/1999 | Oguri et al. ................. 324/750 |
| 6,025,732 A * | 2/2000 | Foo et al. .................... 324/760 |

* cited by examiner

ARRANGEMENT FOR THE TESTING OF SEMICONDUCTOR STRUCTURES

BACKGROUND OF THE INVENTION

The invention relates to an apparatus for testing semiconductor structures, which is provided with a chuck for holding a semiconductor wafer which has a substantially unstructured underside and an upper side with structure of chips that are to be tested. The apparatus is provided with several needle holders, for externally holding contact needles which are placed on contact islands of the chips to be tested. Moreover, the chuck is provided with contacting means for the semiconductor wafer and is moved relative to the contact needles by a positioning device.

It is known that, for testing semiconductor chips, which are in a wafer assembly on a semiconductor wafer, contact needles, which serve to connect the semiconductor chips with an external test apparatus, may be placed on contact islands of the chips.

For testing chips which are separated from the wafer assembly and assembled or pre-assembled into components, it is also known that the radiation behavior of the chips may be investigated. For this, photoemissions, which generally lie in the infrared region and are generated by a circuit structure of the chips during action of electrical voltage on the chips, are determined. Subsequently, malfunctions of the chip tested are detected, for example, by a comparison with radiation images of accurately operating comparison chips or by means of generation of abnormal radiation.

To realize this test method, it is known that an infrared observation device may be used, which is directed towards an upper side of the chip. During a test, this infrared observation device is able to photograph an infrared radiation image of the chip. It is able to portray and analyze extremely weak light, which is generated particularly by malfunctioning of a semiconductor chip. Accordingly, for example, places on the chip can be recognized, which generate heat radiation as a result of a malfunction, which have defective currents due to oxide breakdowns or in gate oxide layers or which do not show the specified emissions at PN transitions, as a result of a malfunction. Such an infrared observation device can be constructed as an emission microscope or as a highly sensitive CCD camera.

However, arranging metal conductors on the chips, in some cases even in several layers, is being exploited increasingly frequently. Generally, these conductors are disposed in top layers of the chip, that is, close to the surface. However, these conductors absorb or reflect the photoemission described so strongly, that they prevent any observation of the extremely weak light radiation by an infrared observation device.

To avoid these disadvantages, it is known that the radiation behavior of the installed chip may be observed from a reverse side of the latter. In this connection, it is a disadvantage that, when a malfunction is detected, the installed chip must be discarded. With that, the expense of installing the chip, which is appreciable in some cases, is no longer of benefit.

SUMMARY OF THE INVENTION

It is therefore an object of the present invention to make it possible to detect defects of non-serviceable or not fully serviceable chips in good time and reliably before chip separation, in order to avoid an unnecessary expense of separating and installing defective chips.

Pursuant to the present invention, this objective is accomplished by a chuck having a receiving area which exposes an underside of a semiconductor wafer in an upward direction, and a receiving plane for the semiconductor wafer being disposed above a needle carrier having contact needles directed upward in such a manner as to contact the contact islands of the semiconductor chips on the downwardly directed upper side of the semiconductor wafer.

The semiconductor wafer is inserted face-down in receiving area of the chuck. Since the semiconductor wafer lies in the receiving plane and, with that, above the needle carriers, and since the needles are directed upward, it becomes possible to contact the semiconductor chips from below. The receiving area exposes the underside of the semiconductor wafer upward, so that the underside can be observed from above.

In an appropriate embodiment of the present invention, provisions are made so that the needle holder is fastened to a support which is stationary with respect to movement of a positioning device, such as an x-y mechanical stage, which moves the semiconductor wafer disposed in the receiving plane.

To realize a relative movement between the chuck and the contact needles, it is possible to move either the chuck or the contact needles. When the needle holder is stationary, a movement of the chuck is realized. Since the chuck generally is the component with the lesser weight, a more rapid positioning of the contact needles is achieved.

It is particularly advantageous if fastening means for fastening the semiconductor wafer are constructed as a mechanical and/or vacuum holding device. The semiconductor wafer is optionally clamped with a mechanical fastening device. This can be realized with simple means. On the other hand, significantly larger holding forces can be achieved with a vacuum holding device, without causing damage to the semiconductor wafer. In practice, it may be advantageous to provide a mechanical as well as a vacuum holding device. The mechanical holding device permits the semiconductor wafer to be held until the vacuum holding device acts.

In an advantageous embodiment, the mechanical fastening device includes a sliding block which, under action of a spring, engages an edge of the semiconductor wafer in such a manner that a force of the spring presses the edge of the semiconductor wafer against opposite stops. When the semiconductor wafer is inserted, the sliding block is simply pressed against the force of the spring and the semiconductor wafer inserted subsequently. When the sliding block is released, the semiconductor wafer is clamped immediately.

In a different advantageous embodiment, which is optionally used in combination with a mechanical holding device, a suction surface, on which the upper side or the underside of the semiconductor wafer is placed and which is provided with a suction groove connected to a vacuum source, is provided as a vacuum holding device. When a semiconductor wafer is placed on the suction surface, the suction groove is closed off, as a result of which the semiconductor wafer is attached by suction and held therewith when a vacuum is applied.

Furthermore, it is advisable to provide the chuck with a spacer which is connected to the x-y mechanical stage and sets a distance between the chuck and the x-y mechanical stage. The spacer makes it possible to dispose components, such as the needle carriers, between the x-y mechanical stage and the chuck. With that, the conventional construction of samplers can be maintained. An alternative includes, for example, initiating the x-y movement from outside, for example, from a remote x-y driving mechanism.

It is particularly advantageous to dispose the positioning device underneath the chuck. With that, all conventional positioning methods can continue to be used, with the sole difference that a direction of an observation device of the positioning device, which usually is constructed as a camera, changes. However, this has little effect on the positioning method.

To realize a spacing holder between the chuck and the needle holder, the chuck is constructed in plate fashion in such a manner, that it has the receiving area for a semiconductor wafer and external brackets, disposed on either side of the receiving area, at outer ends of which brackets the spacers are fastened essentially perpendicularly to the brackets.

In a preferred embodiment of the present invention, the receiving area has an opening with an opening surface, which is at least approximately congruent with a surface of the semiconductor wafer. An annular seat, which decreases an opening area, is provided at the opening on a bottom side of the chuck facing the contact needles. The seat is constructed as a suction surface and provided with an annular groove into which a vacuum duct opens. Advisably, the seat touches only an edge of the semiconductor wafer. With that, a remainder of the semiconductor wafer stays free for contacting or for observation.

It is advisable to construct the vacuum holding device in such a manner that the vacuum duct is passed through the brackets and through the spacer, that a seat, into which the spacer can be inserted and in which the vacuum connection, which can be connected with the vacuum duct of the spacer, is disposed, is provided for a spacer.

As configured above, the chuck, after being equipped with a semiconductor wafer, is placed down and, at the same time, supplied with a vacuum.

A variation of the present invention includes a fastening plate with a structure for receiving a needle holder for testing the reverse side of the semiconductor wafer and with a structure for receiving an additional receiving plate for testing the upper side of the semiconductor wafer, which can be fastened with spacers to the fastening plate and on which the needle holders can be fastened, the contact needles being directed upward for testing the reverse side and downward for testing the upper side. Accordingly, needle holder can simply be removed from the fastening plate when the testing method is changed and fastened to the receiving plate. In this case, the contact needles are changed with respect to their direction of contact, that is, the contact needles now contact the contact islands of the semiconductor chips on the upwardly directed upper side of the semiconductor wafer.

BRIEF DESCRIPTION OF THE DRAWINGS

The present invention will be described in greater detail in the following by means of an example. In the associated drawings.

FIG. 4b shows a side view of the embodiment of FIG. 4a;

DETAILED DESCRIPTION

Figure 1A:
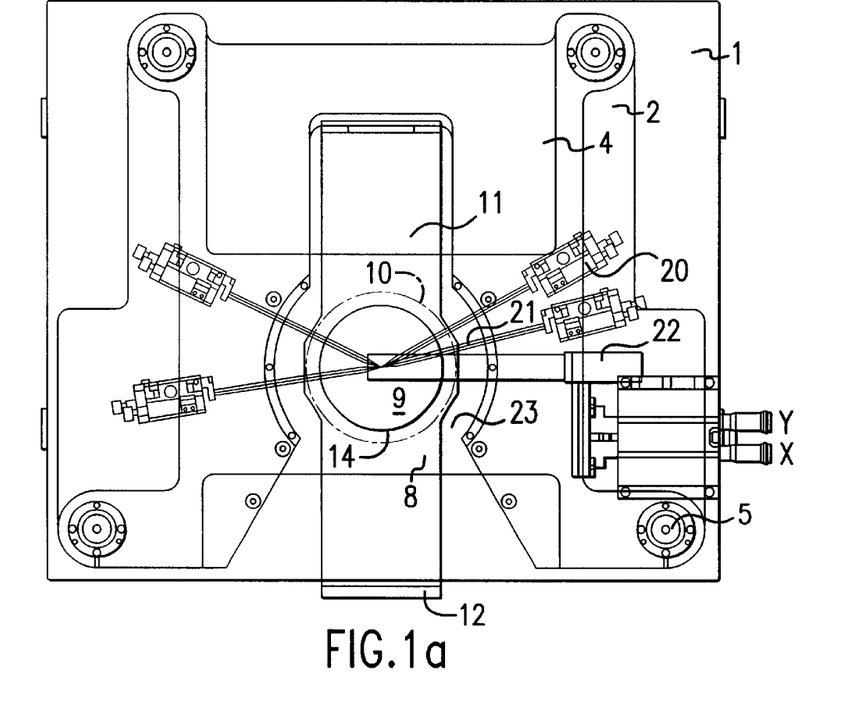
FIG. 1a shows a plan view of a first embodiment of an apparatus of the present invention for testing a semiconductor wafer from below using needles.
Figure 1B:
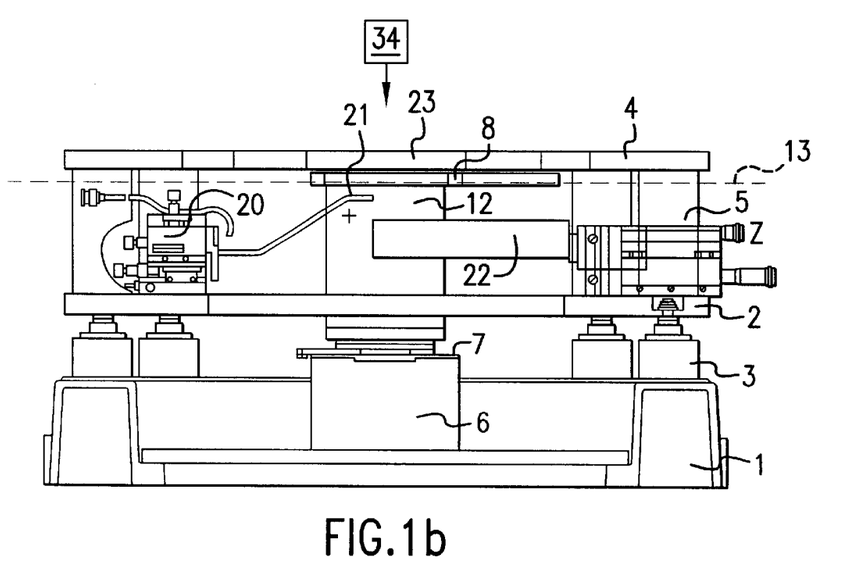
FIG. 1b shows a front view of the first embodiment.

Referring to FIGS. 1a and 1b, an apparatus for testing semiconductor wafers has a base frame 1. A base plate 2 is connected via decoupling elements 3 to the base frame 1. An upper plate 4 is supported by a spacer 5 on the base plate 2.

A positioning device 6, which positions in a horizontal x direction and a horizontal y direction, is connected to the base frame 1. The positioning device 6 has a stage 7, onto which a chuck 8 is disposed. The chuck 8 serves to receive a semiconductor wafer 9 having a top side 9a and a bottom side 9b as shown in FIG. 2b. For this purpose, an opening 14, of a receiving area 10, is provided in the upper side of the chuck 8 for exposing the bottom side 9b of the wafer 9 to an infrared observation device 34. Since the receiving area 10 is in the vicinity of the upper plate 4, that is, above the base plate 2, the chuck 8 amply embraces the base plate 2, so that a transfer of movement of the positioning device 6 to the chuck 8 is possible. For this purpose, brackets 11 are provided, which are on either side of the receiving area 10 of the chuck 8. Spacers 12, which adjust a distance between the stage 7 and the receiving plate 13 of the semiconductor wafer 9, are fastened to outer ends perpendicularly to the brackets 11.

Figure 2A:
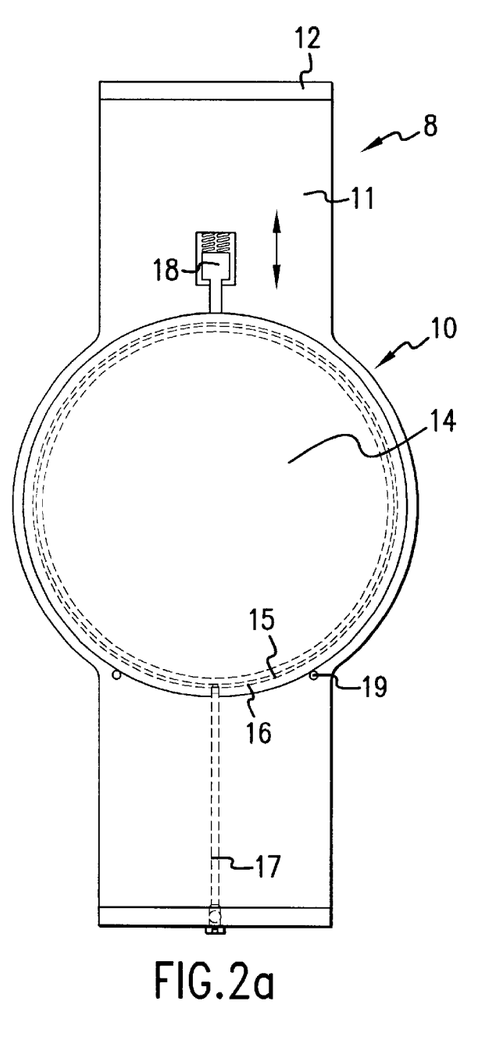
FIG. 2a shows a bottom view of a chuck of the first embodiment.
Figure 2B:
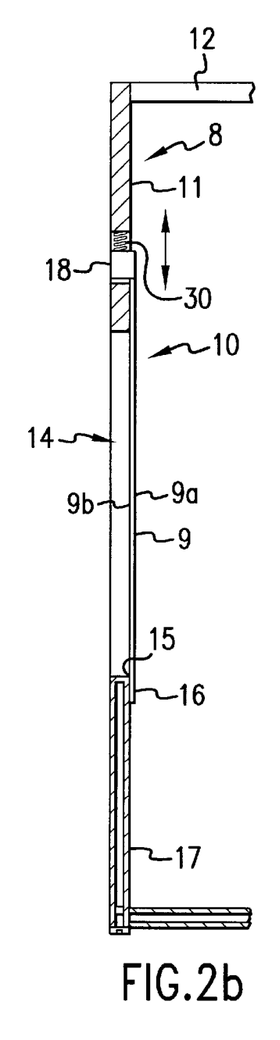
FIG. 2b shows a longitudinal side section view of the first embodiment.

Referring to FIGS. 2a and 2b, on an upper side, the chuck 8 is constructed plate-shaped, the surface being at least parallel to the receiving plane 13 of the semiconductor wafer 9. In the receiving area 10, the chuck 8 is provided with an opening 14. A surface perimeter of the opening 14 is approximately congruent with the surface of the semiconductor wafer 9, so that the semiconductor wafer 9 can be inserted in the opening 14. For fixing the semiconductor wafer 9, the opening 14 is provided with an annular seat 15. An annular groove 16, which is closed off by the semiconductor wafer 9 when seated, is in this annular seat 15. A vacuum duct 17, which passes through a bracket 11 and furthermore through the spacer 12 and emerges at an end of the spacer 12, opens out into the annular groove 16 and communicates with a vacuum opening in the stage 7. With that, vacuum suction for the semiconductor wafer 9 can be realized in the receiving area 10. A mechanical fastening means is provided for provisionally fixing the semiconductor wafer 9 before a vacuum is built up and includes a sliding block 18, which is moved in a radial direction with respect to the opening 14 and parallel to the receiving plane 13 and which, under the action of a spring 30, engages the edge of the semiconductor wafer 9. With that, the semiconductor wafer 9 is pressed against two pins 19, acting as stops, and thus fixed mechanically. This has the advantage that the semiconductor wafer 9 can be inserted in the opening 14 and is already fixed mechanically therewith. With the placement of the chuck 8 on the stage 7, the annular groove 16 is then acted upon by a vacuum, as a result of which the semiconductor wafer 9 is attached by suction and held.

By attachment by suction, on the one hand, the semiconductor wafer 9 is fixed in position and, on the other, contacting forces can be absorbed therewith when the semiconductor wafer 9 is contacted on the side, on which it is also held. As shown in FIGS. 1a and 1b, the base plate 2 serves for receiving needle holders 20, which carry contact needles 21. If now upwardly directed the contact needles 21 are inserted in the needle holder 20, the contact needles 21 engage contact islands on the semiconductor wafer 9 and the testing is commenced. An observation microscope 22 is disposed between the base plate 2 and the upper plate 4 for setting a relative position between the semiconductor wafer 9 and the contact needles 21.

In the region above the receiving area 10 of the chuck, the upper plate 4 has an observation opening 23. With that, it becomes possible, in a manner not shown in detail, to observe the reverse side of the semiconductor wafer 9, which is on top, through this observation opening 23 and through the opening 14, while the contact needles 21 engage the front side of the semiconductor wafer 9.

Figure 3A:
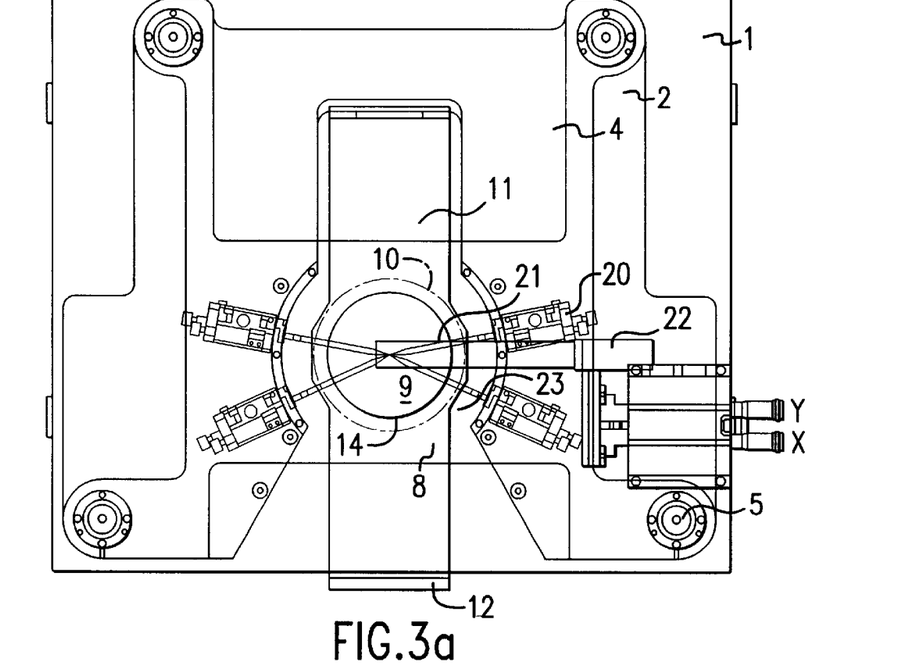
FIG. 3a shows a plan view of a second embodiment of the present invention for testing a semiconductor wafer by means of contacting needles engaging from above.
Figure 3B:
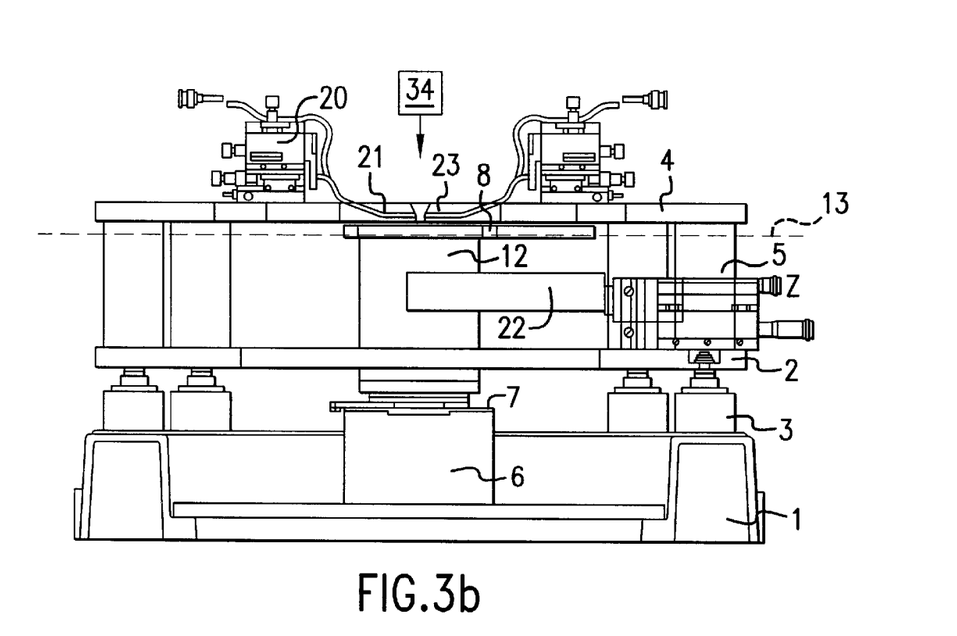
FIG. 3b shows a side view of the second embodiment.

As shown in FIGS. 3a and 3b, it is also possible to design the receiving area 10 of the chuck 8 in such a manner, that the semiconductor wafer 9 can be inserted from above and locked. The needle holders 20 can then be disposed on the upper plate 4, the contact needles 21 then engaging the semiconductor wafer 9 from above.

Figure 4A:
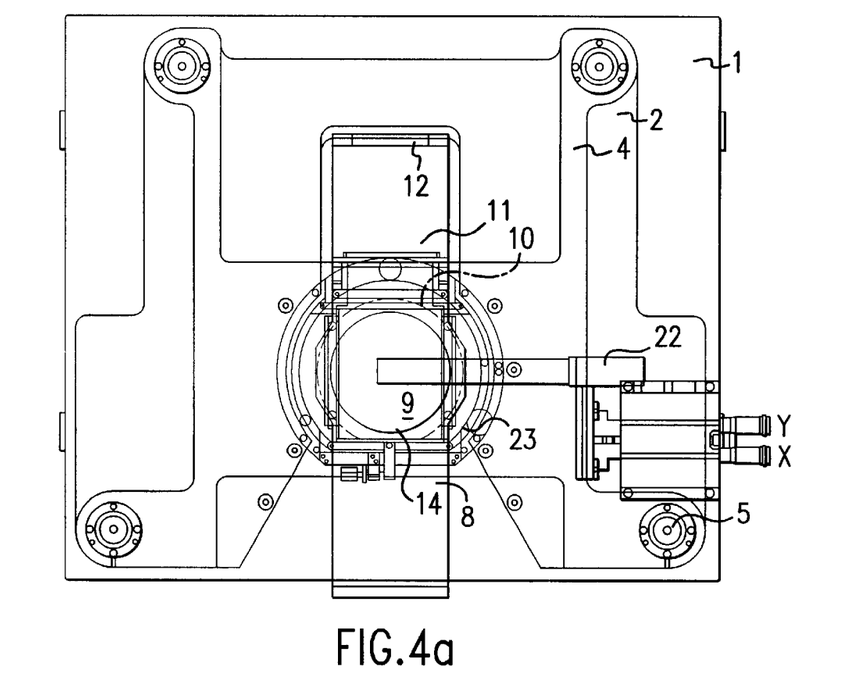
FIG. 4a shows a plan view of a third embodiment of the present invention for testing a semiconductor wafer by means of a tester card engaging from below.
Figure 4B:
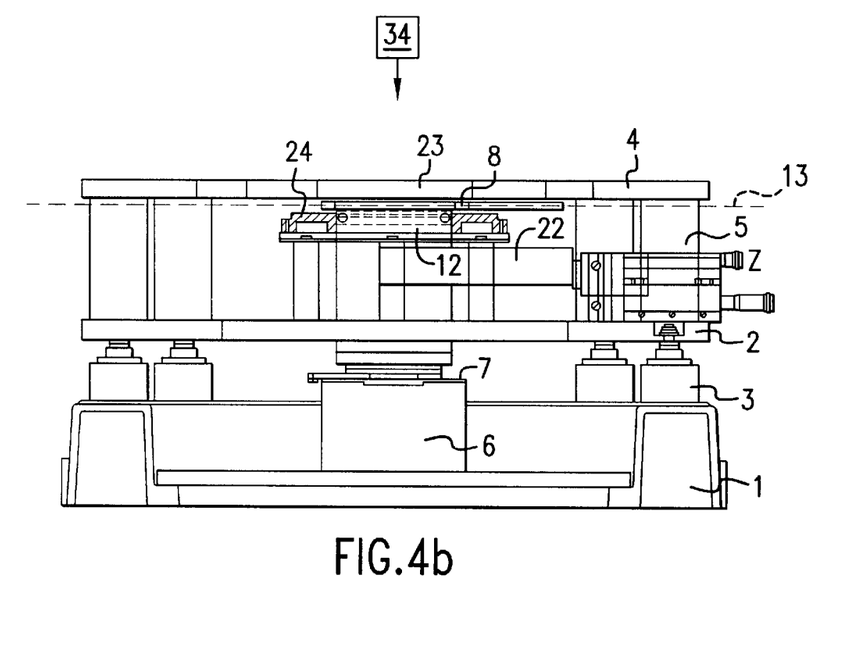

FIGS. 4a and 4b shows the possibility of using a tester card. The contact needles 21 are fastened on a tester card. The tester card is fixed to the base plate 2 via an adapter 24. Accordingly, the contact needles 21, the details of which are not shown, engage the tester card on the front side of the semiconductor wafer 9, which is on the bottom. At the same time, it is possible to observe the reverse side of the semiconductor wafer 9 from above.

Figure 5A:
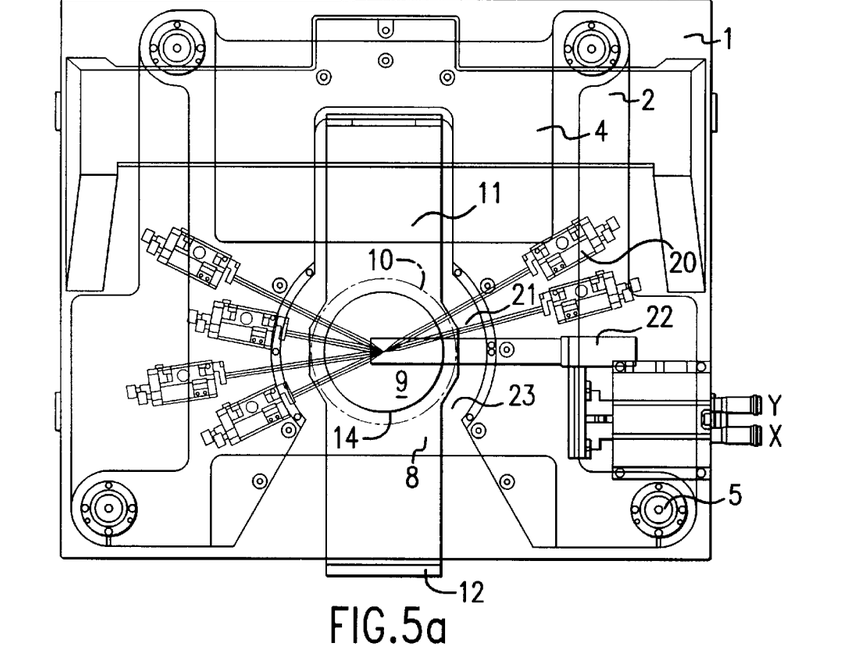
FIG. 5a shows a plan view of a fourth embodiment of the present invention for testing a semiconductor wafer by means of contacting needles engaging from below and above.
Figure 5B:
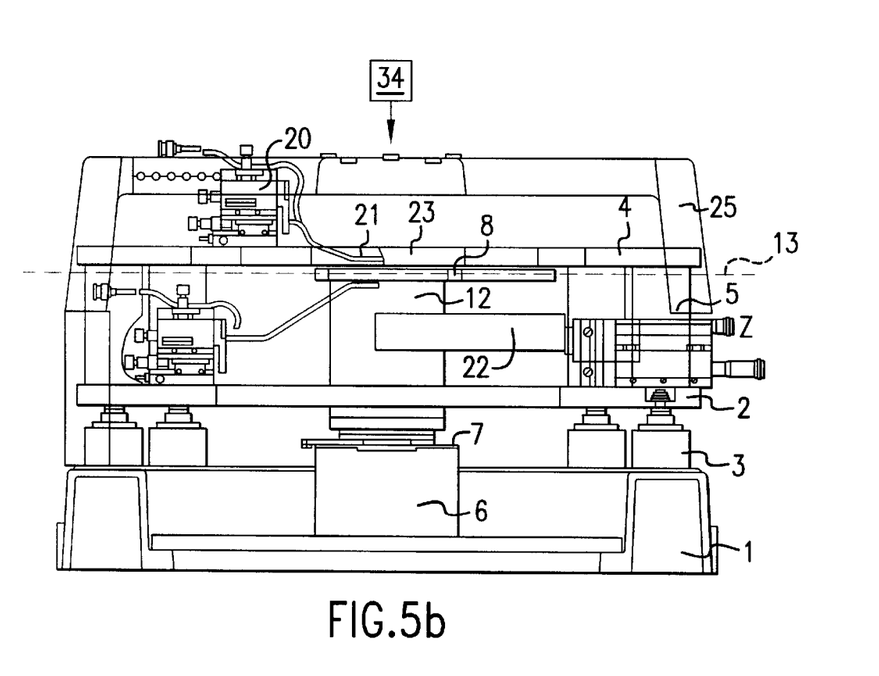
FIG. 5b shows a front view of the fourth embodiment.
Figure 6A:
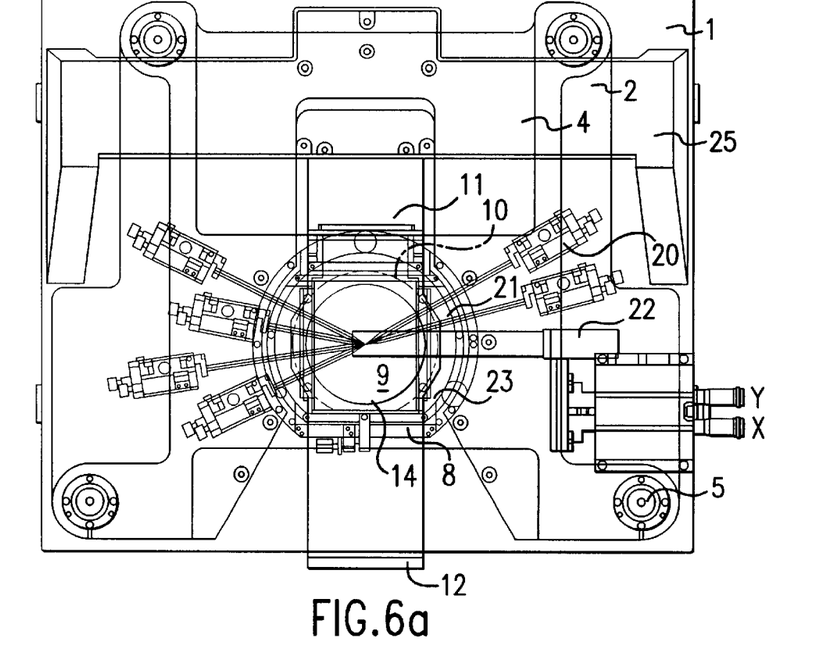
FIG. 6a shows a plan view of a fifth embodiment of the present invention for testing a semiconductor wafer by means of contacting needles engaging from above and below and a tester card engaging from below.
Figure 6B:
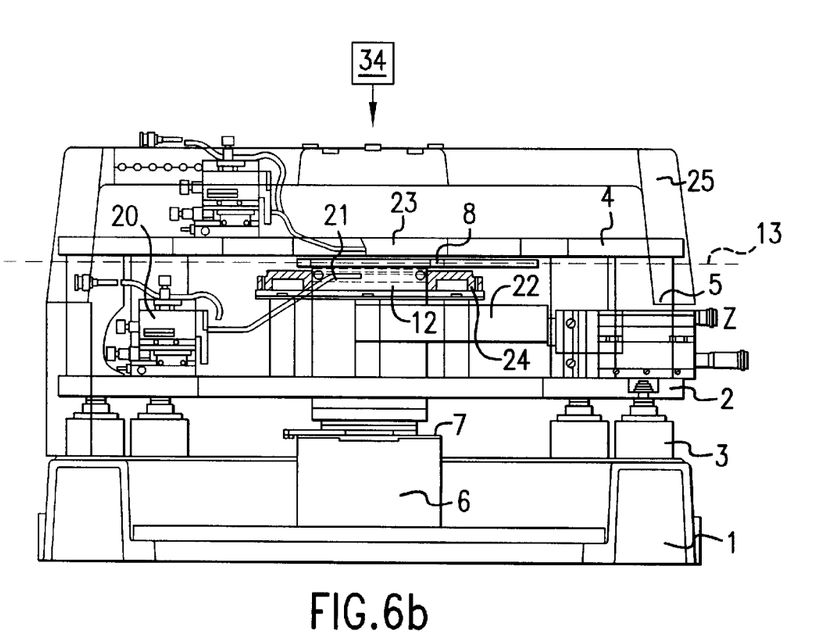
FIG. 6b shows a front view of the fifth embodiment.

In FIGS. 5a and 5b, a combined possibility of simultaneously contacting front and reverse sides by means of contact needles 21, is shown. FIGS. 6a and 6b show the simultaneous contacting of the front and reverse sides by means of contact needles 21 and a simultaneous use of a tester card. In FIGS. 5a–6b, a microscope bridge 25 over the upper plate 4 is shown, on which the observation microscope, the details of which are not shown, can be fastened.

What is claimed is:

1. An apparatus for testing semiconductor structures on a top side of a semiconductor wafer wherein the semiconductor structures are chips and contact islands are provided on the chips on the top side of the wafer, and a bottom side of the semiconductor wafer is exposed during testing, the apparatus comprising:

needle holders for holding contact needles for contacting the contact islands of the chips to effect electrical connection for testing;

a support structure supporting the needle holders;

a chuck, mounted on said support structure, for holding the semiconductor wafer in a receiving plane with the top side of the semiconductor wafer facing in a downward direction such that respective ones of the contact needles are disposed beneath and in contact with respective ones of the contact islands;

the chuck supporting the semiconductor wafer with the bottom side of the semiconductor wafer facing in an upward direction exposed so as to permit optical inspection thereof from above;

a positioning device for effecting relative movement of said chuck with respect to said contact needles to effect alignment of said contact needles with a respective one of the chips; and an infrared observation device disposed outside said support structure and above the bottom side of the wafer to conduct the optical inspection.

2. The apparatus of claim 1, wherein said chuck has a chuck member defining an opening and a receiving area for accepting the semiconductor wafer at a position aligned with said opening such that the top side of the semiconductor wafer has said contact islands in contact with said contact needles and the bottom side of the semiconductor wafer is exposed for the optical inspection via said opening.

3. The apparatus of claim 1, wherein said positioning device comprises an x-y positioning stage supporting said chuck on said support structure.

4. The apparatus of claim 1, wherein said chuck includes a fastening device for holding said semiconductor wafer by means of at least one of mechanical pressure or vacuum differential pressure.

5. The apparatus of claim 1, wherein:

said chuck has a chuck member defining an opening and a receiving area for accepting the semiconductor wafer at a position aligned with said opening such that the top side of the semiconductor wafer has said contact islands in contact with said contact needles and the bottom side of the semiconductor wafer exposed for the optical inspection;

said chuck includes a vacuum fastening device for holding said semiconductor wafer in said receiving area including:

said chuck member having a vacuum sealing surface in said receiving area whereat a portion of said semiconductor wafer is seated;

said vacuum sealing surface defining a suction groove which is sealed by seating of said semiconductor wafer; and means for connecting said suction groove to a vacuum source.

6. The apparatus of claim 1, wherein said positioning device is disposed below said chuck.

7. The apparatus of claim 1, further comprising:

spacer members mounted on said positioning device and supporting said chuck spaced from said positioning device;

said chuck having:

a chuck plate member having a receiving area for accepting the semiconductor wafer and defining an opening, said receiving area positioning the semiconductor wafer aligned with said opening such that the top side of the semiconductor wafer has said contact islands in contact with said contact needles and the bottom side of the semiconductor wafer exposed for the optical inspection; and external brackets disposed on opposing sides of said receiving area and connecting said chuck plate member to said spacer members.

8. The apparatus of claim 1, wherein:

said chuck has a chuck plate member having a receiving area for accepting the semiconductor wafer and defining an opening, said receiving area positioning the semiconductor wafer aligned with said opening such that the top side of the semiconductor wafer has said contact islands in contact with said contact needles and
the bottom side of the semiconductor wafer exposed for
the optical observation;

said receiving area includes an annular seat around the
opening, at least a portion of said annular seat being a
vacuum sealing surface whereat a portion of said
semiconductor wafer is seated;

said vacuum sealing surface defining a suction groove
which is sealed by seating of said semiconductor wafer;
and means for connecting said suction groove to a vacuum
source.

9. The apparatus of claim 1 further comprising:

said positioning device comprising an x-y positioning
stage mounted on said support structure;

a spacer member supporting said chuck on said x-y
positioning stage at a vertical distance above the x-y
positioning stage; and an observation microscope for,observing alignment of
said contact needle with said contact islands, said
observation microscope being disposed below said
chuck, beneath said top side of said wafer, and higher
than the x-y positioning stage wherein said spacer
member supports said chuck above said observation
microscope.

10. The apparatus of claim 1 wherein:

said support structure includes a fastening plate having
mounted thereon said needle holders for holding said
needles contacting the contact islands on the top side of
said semiconductor wafer to effect said electrical connection for testing;

said support structure includes a receiving plate supported
on receiving plate spacers mounted on said fastening
plate; and further needle holders are provided, mounted on said
receiving plate, for holding further needles for contacting the bottom side of the semiconductor wafer.

11. The apparatus of claim 1, wherein said chuck includes
a mechanical fastening device for holding said semiconductor wafer.

12. The apparatus of claim 11, wherein:

said chuck has a chuck member defining an opening and
a receiving area for accepting the semiconductor wafer
at a position aligned with said opening such that the top
side of the semiconductor wafer has said contact
islands in contact with said contact needles and the
bottom side of the semiconductor wafer exposed for the
optical inspection; and said mechanical fastening means includes:
at least one stop on said chuck member for engaging an
edge portion of said semiconductor wafer;
a sliding block slidably mounted in said chuck member
to slide into said receiving area to engage another
edge portion of said semiconductor wafer; and
a biasing device for biasing said sliding block into said
receiving area to engage the another edge portion of
the semiconductor wafer to press the edge portion of
the semiconductor wafer against said at least one
stop.

13. The apparatus of claim 7, wherein:

said receiving area includes an annular seat around the
opening, at least a portion of said annular seat being a
vacuum sealing surface whereat a portion of said
semiconductor wafer is seated;

said vacuum sealing surface defining a suction groove
which is sealed by seating of said semiconductor wafer;
and means for connecting said suction groove to a vacuum
source.

14. The apparatus of claim 13, wherein said means for
connecting said suction groove to a vacuum source includes
a vacuum duct passed through at least one of said external
brackets and at least one of said spacer members.

15. An apparatus for testing semiconductor structures on
a top side of a semiconductor wafer wherein the semiconductor structures are chips and contact islands are provided
on the chips on the top side of the wafer, and a bottom side
of the semiconductor wafer is exposed during testing, the
apparatus comprising:

needle holders for holding contact needles for contacting
the contact islands of the chips to effect electrical
connection for testing;

a support structure supporting the needle holders;

a chuck, mounted on said support structure, for holding
the semiconductor wafer in a receiving plane with the
top side of the semiconductor wafer facing in a downward direction such that respective ones of the contact
needles are disposed beneath and in contact with
respective ones of the contact islands;

the chuck supporting the semiconductor wafer with the
bottom side of the semiconductor wafer facing in an
upward direction exposed so as to permit optical
inspection thereof from above;

a positioning device for effecting relative movement of
said chuck with respect to said contact needles to effect
alignment of said contact needles with a respective one
of the chips, said positioning device comprising an x-y
positioning stage mounted on said support structure;

a spacer member supporting said chuck on said x-y
positioning stage at a vertical distance above the x-y
positioning stage;

an observation microscope for observing alignment of
said contact needle with said contact islands, said
observation microscope being disposed below said
chuck, beneath said top side of said wafer, and higher
than the x-y positioning stage wherein said spacer
member supports said chuck above said observation
microscope; and an infrared observation device disposed above the bottom
side of the wafer to conduct the optical inspection.

16. The apparatus of claim 15 wherein:

said support structure includes a fastening plate having
mounted thereon said needle holders for holding said
needles contacting the contact islands on the top side of
said semiconductor wafer to effect said electrical connection for testing;

said support structure includes a receiving plate supported
on receiving plate spacers mounted on said fastening
plate; and further needle holders are provided, mounted on said
receiving plate, for holding further needles for contacting the bottom side of the semiconductor wafer.

17. An apparatus for testing semiconductor structures on
a top side of a semiconductor wafer wherein the semiconductor structures are chips and contact islands are provided
on the chips on the top side of the wafer, and a bottom side
of the semiconductor wafer is exposed during testing, the
apparatus comprising:

needle holders for holding contact needles for contacting
the contact islands of the chips to effect electrical
connection for testing;

a support structure supporting the needle holders;

a chuck, mounted on said support structure, for holding the semiconductor wafer in a receiving plane with the top side of the semiconductor wafer facing in a downward direction such that respective ones of the contact needles are disposed beneath and in contact with respective ones of the contact islands;

the chuck supporting the semiconductor wafer with the bottom side of the semiconductor wafer facing in an upward direction exposed so as to permit optical inspection thereof from above;

a positioning device for effecting relative movement of said chuck with respect to said contact needles to effect alignment of said contact needles with a respective one of the chips;

an observation microscope for observing alignment of said contact needle with said contact islands;

an infrared observation device disposed above the bottom side of the wafer to conduct the optical inspection;

said support structure including a fastening plate having mounted thereon said needle holders for holding said needles contacting the contact islands on the top side of said semiconductor wafer to effect said electrical connection for testing;

said support structure including a receiving plate supported on receiving plate spacers mounted on said fastening plate; and further needle holders, mounted on said receiving plate, for holding further needles for contacting the bottom side of the semiconductor wafer.

* * * * *